United States Patent [19]

Bahl

[11] Patent Number: 5,338,950
[45] Date of Patent: Aug. 16, 1994

[54] MULTIPLE PORT THIN FILM CAPACITOR

[75] Inventor: Inder J. Bahl, Roanoke, Va.

[73] Assignee: ITT Corporation, New York, N.Y.

[21] Appl. No.: 110,575

[22] Filed: Aug. 23, 1993

[51] Int. Cl.5 ............................................. H01L 27/02
[52] U.S. Cl. ................................... 257/277; 257/532; 333/24 C
[58] Field of Search ............... 257/277, 532, 534, 275; 361/329; 333/24 C

[56] References Cited

U.S. PATENT DOCUMENTS 4,656,054 4/1987 Inoue ...................................... 427/81
4,697,159 9/1993 Sechi et al. ......................... 333/24 C

FOREIGN PATENT DOCUMENTS 2-159736 6/1990 Japan ................................... 257/277

OTHER PUBLICATIONS

"Simulation Tool Accurately Models MMIC Passive Elements", *Microwave & RF*, vol. 27, No. 1, Jan. 1988, by: Y. L. Chow, G. Howard, and M. G. Stubbs.
"Dielectric Films for Capacitor Applications in Electronic Technology", *Proceedings of the IEEE*, vol. 59, No. 10, Oct. 1971, by: J. R. Szedon, W. J. Takei.
"Applications of Integrated Circuit Technology to Microwave Frequencies", *Proceedings of the IEEE*, vol. 59, No. 8., Jan. 7, 1971, by: Harold Sobol.

*Primary Examiner*—Jerome Jackson
*Assistant Examiner*—Donald L. Monin, Jr.
*Attorney, Agent, or Firm*—Arthur L. Plevy; Patrick M. Hogan

[57] ABSTRACT

A capacitor element for an integrated circuit comprises a thin layer of dielectric material laminarly disposed between first and second layers of electrically conductive material. Each of the layers has n sides, where n is an even integer greater than four. Preferably, each layer of the capacitor, and therefore the capacitor itself, is shaped as an equiangular polygon. Although, the capacitor may be configured as a hexagon, a decagon, etc., an octagonal configuration is preferred. By eliminating the 90 feed bend, substantial reductions in discontinuity reactances are obtained.

The capacitor element may be provided as an element of a hybrid or a monolithic circuit. When the capacitor element is employed as an element of a microwave circuit, the first conductive layer is deposited on a substrate of a semi-insulating material such as gallium arsenide. The dielectric layer may be formed from silicon nitride, silicon dioxide, silica, or tantalum pentoxide, depending upon the specific capacitance required by the application.

12 Claims, 4 Drawing Sheets

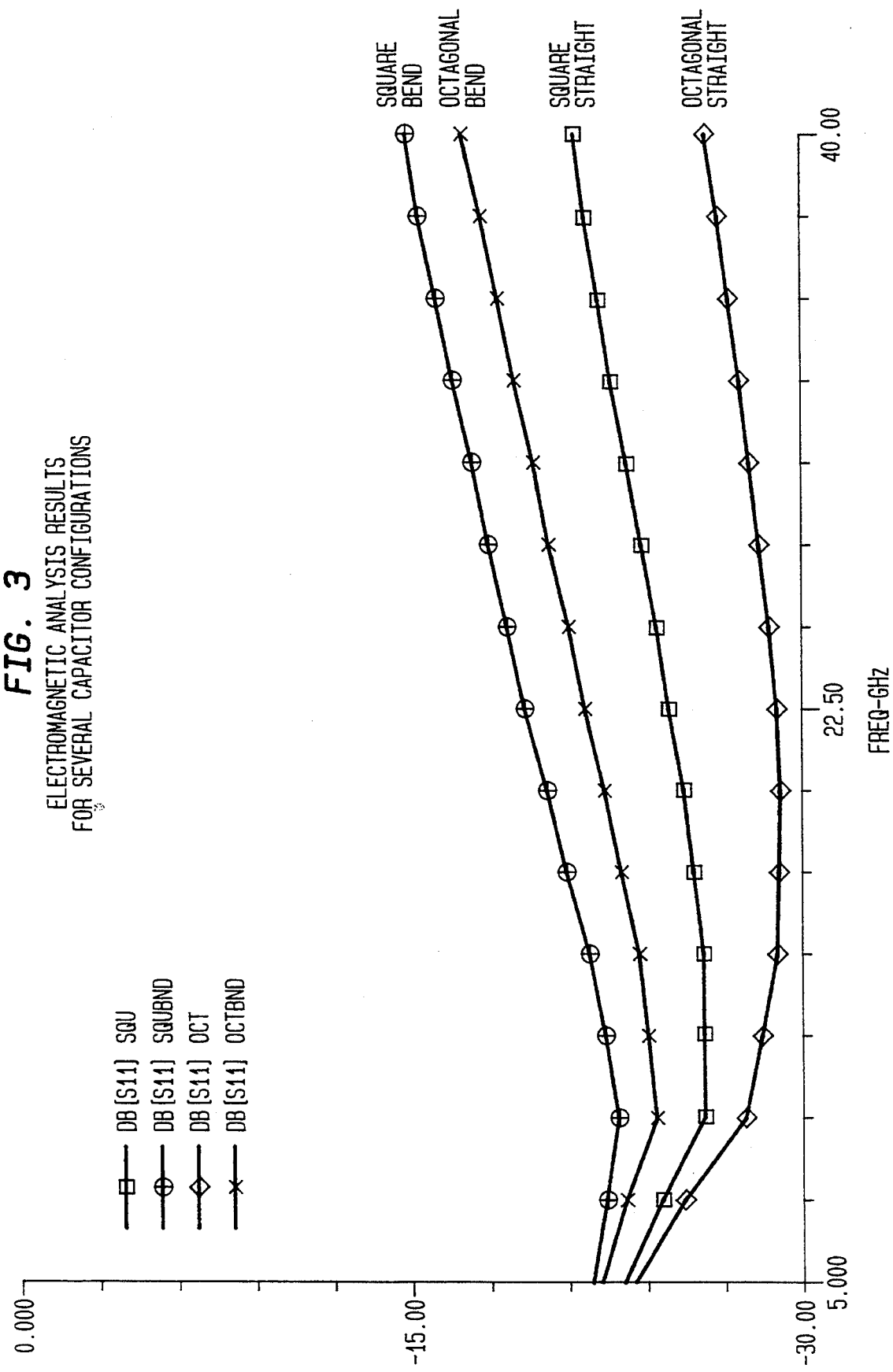

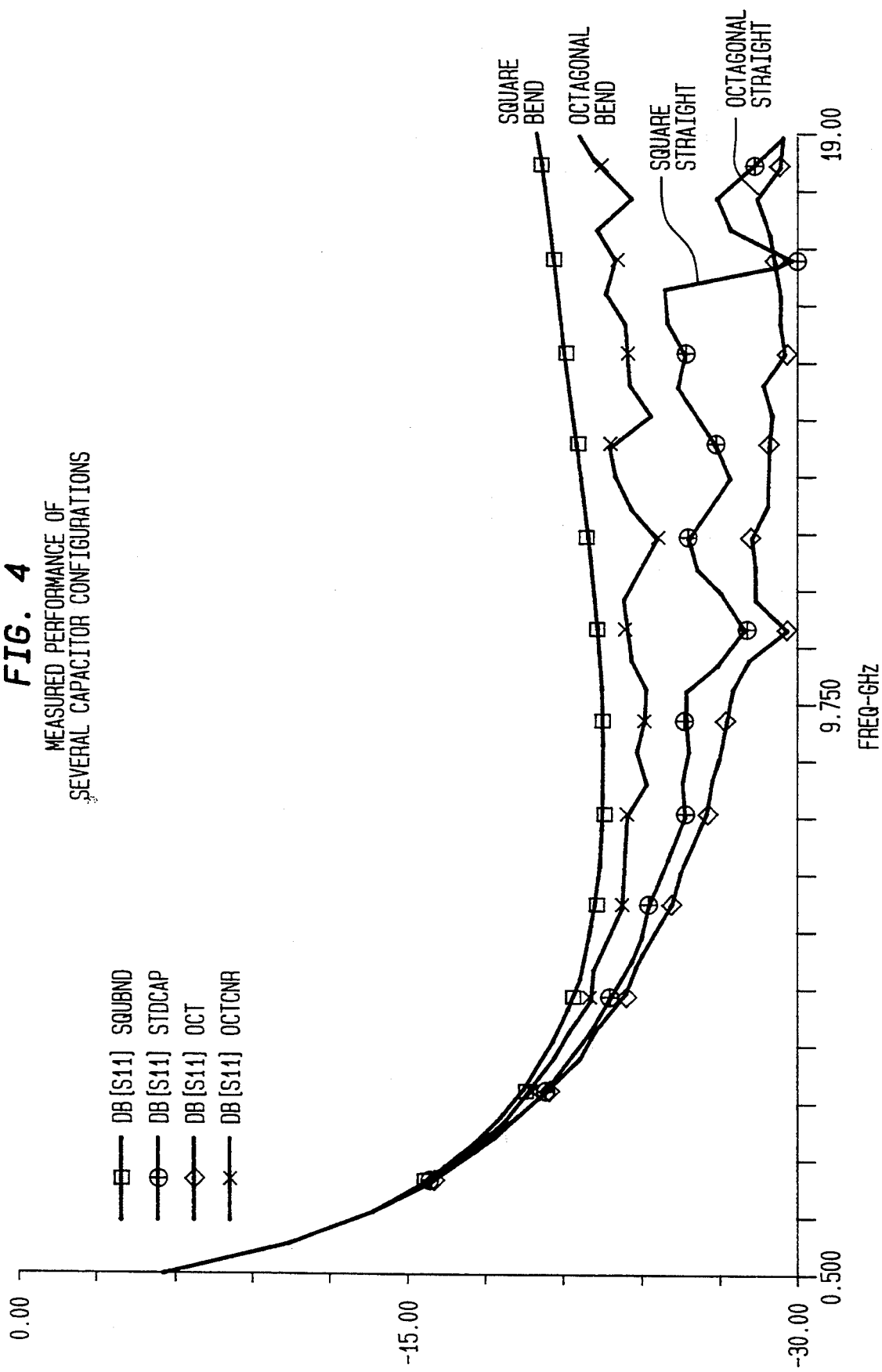

MULTIPLE PORT THIN FILM CAPACITOR

FIELD OF THE INVENTION

This invention relates to thin film circuit elements generally, and more particularly to a multiple port metal-insulator-metal capacitor element having improved operating characteristics.

BACKGROUND OF THE INVENTION

The microwave frequency range is in that portion of the electromagnetic spectrum where the wavelength is of the same order of magnitude as the characteristic size of the circuit carrying the electrical energies. The frequencies most often considered to be in that category lie approximately between 1 and 200 GHz. Through the use of microwave integrated circuits, the microwave frequency range has been widely employed in communications systems, radar systems, and in various other applications. Capacitors adapted to operate at microwave frequencies are an integral pan of microwave integrated circuits, finding use in filters, dividers and couplers, as well as in impedance matching, RF bypassing and DC blocking circuits. The metal-insulator-metal (MIM) capacitor structure is the most commonly employed capacitor type in microwave integrated circuits.

The MIM capacitor is a direct miniaturization of the conventional parallel plate capacitor. In monolithic microwave integrated circuits (MMICs), MIM capacitors are generally fabricated by sandwiching a thin layer of a low loss dielectric between two metal plates. The choice of lumped or distributed elements depends largely upon the frequency of operation. Lumped elements are suitable through X-band up to, perhaps, 20 GHz. Beyond this frequency range, distributed elements are generally preferred. It is difficult, however, to realize a truly lumped element, even at the lower frequencies, because of the parasitic to ground associated with thin substrates.

In FIG. 1A, there is illustrated a perspective view of a typical MIM capacitor 1 positioned on a semi-insulating substrate 2. The bottom plate 3 is comprised of a thin unplated metal while the dielectric layer 4 disposed thereon is comprised of a dielectric material having a sufficiently high dielectric constant to provide the desired capacitance. The dielectric material is typically Silicon Nitride ($Si_3N_4$), although other materials can be employed. The top plate 6 generally comprises a thick plated conductor to reduce the loss in the capacitor. The top plate is generally connected to other circuitry via an air bridge which provides higher breakdown voltages.

When a MIM capacitor is used in a monolithic microwave integrated circuit (MMIC), two or more connections are generally made between the capacitor and other circuit elements. These multiport connections may be placed anywhere along the periphery of the capacitor as required by the design considerations of circuit layout compactness and flexibility. In the circuit shown in FIG. 1A, these connections are made by means of air bridges 7 and 8. A disadvantage of multiport connections to conventional capacitors, however, is that both collinear and non-collinear connections introduce performance degrading parasitic reactances in the current path of the circuit. FIGS. 1B and 1C exemplify two types of multiport capacitor connections. FIG. 1B depicts a straight feed configuration in which connections are made to the capacitor 1 at defined collinear ports 8a and 8b to minimize the level of discontinuity in the current path. FIG. 1C illustrates a bend-feed configuration in which circuit layout considerations preclude a collinear arrangement between defined ports 9a and 9b. Instead, the connections are made to the capacitor 1 at right angles, thereby resulting in very high discontinuity reactances and in a substantial degradation of performance.

Accordingly, it is an objective of the present invention to provide a MIM capacitor which is capable of accommodating non-collinear multiport connections while minimizing the level of added discontinuity reactances. It is also an objective of the present invention to provide a MIM capacitor which improves the performance of collinear multiport connections as well.

SUMMARY OF THE INVENTION

A capacitor element for an integrated circuit fabricated in accordance with the present invention comprises a thin layer of dielectric material laminarly disposed between first and second layers of electrically conductive material. Each of the layers has a number n of equal sides, where n is an even integer greater than four. Preferably, each layer of the capacitor, and hence the capacitor itself, is shaped as an octagon.

The capacitor element of the present invention may be provided as an element of a hybrid or a monolithic circuit. Additionally, the capacitor element may be provided as an element of a microwave circuit wherein the first layer is deposited on a substrate of a semi-insulating material such as gallium arsenide. The dielectric layer is preferably formed from a material selected from the class consisting of silicon nitride ($Si_3N_4$), silicon dioxide ($SiO2$), silica, and tantalum pentoxide.

BRIEF DESCRIPTION OF THE DRAWINGS

FIG. 3 is a graphical representation comparing the simulated straight and bent feed return loss of the prior art MIM capacitor (FIGS. 1B and 1C) to those of the MIM capacitor of the present invention (FIGS. 2B and 2C); and FIG. 4 is a graphical representation comparing the actual measured straight and bent feed return loss of the prior an MIM capacitor (FIGS. 1B and 1C) to those of the MIM capacitor of the present invention (FIGS. 2B and 2C).

DETAILED DESCRIPTION OF THE INVENTION

Figure 2A:
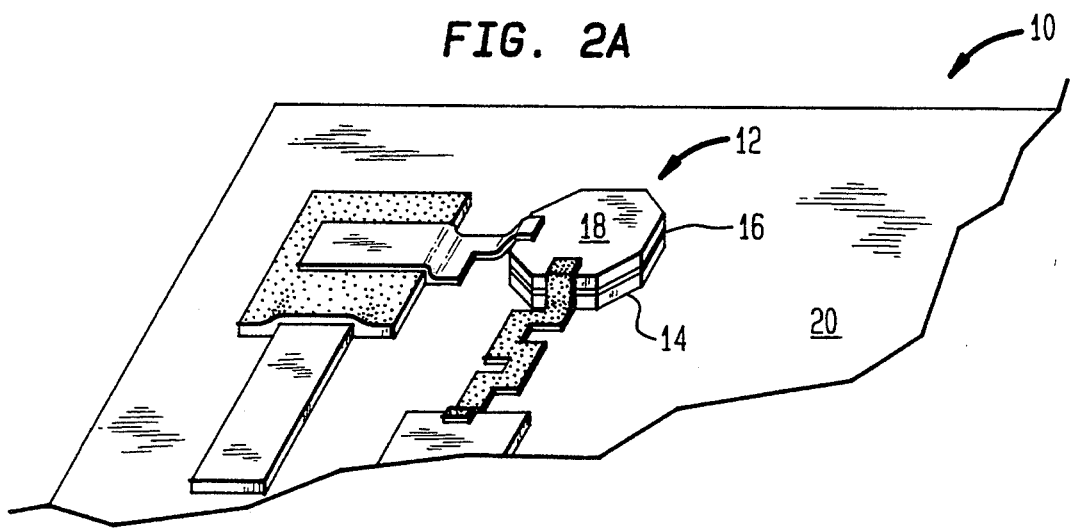
FIG. 2A is a partial perspective view of an integrated circuit incorporating a thin film MIM capacitor constructed in accordance with a preferred embodiment of the present invention.

With reference now to FIG. 2A, there is shown in partial perspective view a monolithic microwave integrated circuit MMIC 10 utilizing an MIM capacitor 12 constructed in accordance with one embodiment of the present invention. Although the capacitor of the present invention is described in connection with a monolithic microwave circuit, it is also contemplated that it may be employed in a hybrid microwave integrated circuit as well as monolithic or hybrid integrated circuits designed for lower frequencies.

By definition, a monolithic circuit is formed completely by a deposition method such as liquid phase epitaxy, vapor phase epitaxy, ion implantation, evaporation, or sputtering. Accordingly, the bottom plate 14, dielectric layer 16, and top plate 18 are deposited on a semi-insulating substrate 20 and defined photolithographically or utilizing some other well known technique to obtain the octagonally shaped configuration shown in FIG. 2A. The series resistance in the plates is determined by the skin resistance if the metal thickness exceeds the skin depth, or the bulk metal resistance if the reverse is true. Usually, the bottom layer is evaporated only, and hence is about 0.5 $\mu$m thick, which may be less than the skin depth. The top metal is normally built up to a thickness of several microns or more by plating.

Figure 1A:
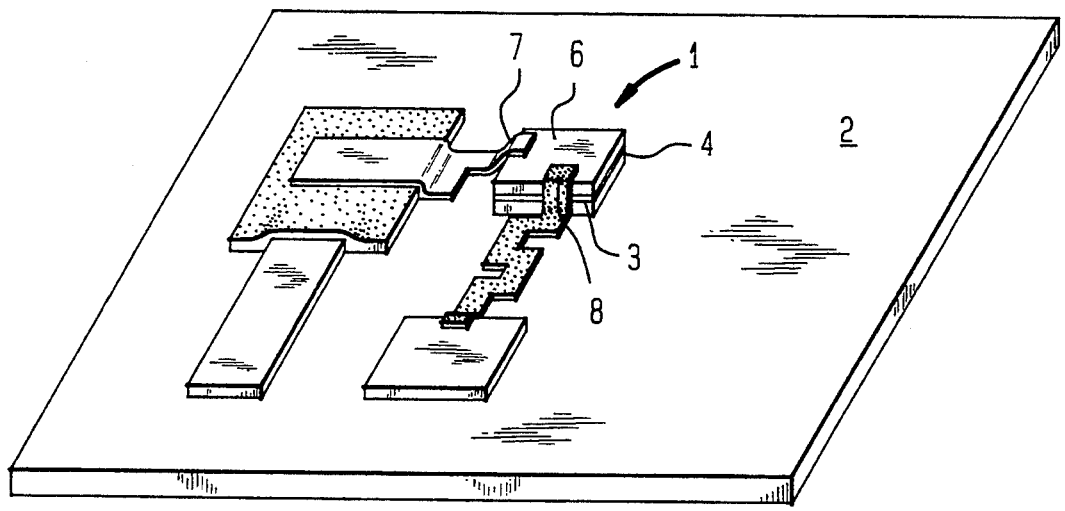
FIG. 1A is a perspective view of an integrated circuit utilizing a conventional thin film MIM capacitor.
Figure 1B:
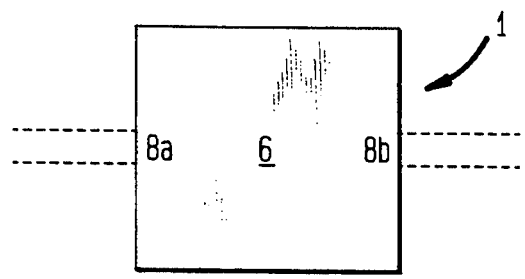
FIG. 1B is a plan view illustrating a straight feed connection to the conventional MIM capacitor depicted in FIG. 1A.

To evaluate the properties of an octagonally configured capacitor constructed in accordance with one embodiment of the present invention, four 5 pF MIM capacitors were fabricated. A first identical pair of capacitors were constructed utilizing the square configuration of the prior art, as illustrated in FIG. 1A, while the remaining pair of capacitors were formed utilizing the octagonal configuration of the present invention illustrated in FIG. 2A. The fabrication of an octagonally shaped capacitor in accordance with the present invention will now be described, it being understood that all of the capacitors tested were fabricated in an identical manner. It will, of course, be appreciated that such a capacitor will typically be fabricated simultaneously with other passive and/or active devices on the substrate.

A Ti/Au first level metallization on a 125 $\mu$m thick, GaAs substrate provides the bottom layer 14 or lower electrode of each MIM capacitor. This metallization may also be used to provide overlays for ohmic contacts (not shown). The first level metal pattern may be defined by ion milling through a photoresistive mask to remove unwanted areas so as to achieve chamfered corners of the remaining metal, realizing the octagonal shape of the illustrative embodiment. The evaporated layer is masked and etched to obtain the octagonal shape. It will be readily apparent to those skilled in the art that the bottom plate may be fabricated from any thin metal or metal alloy which provides the sheet resistivity required for the particular application and that such materials may be deposited by any suitable microwave circuit fabrication technique. The sheet resistance of the illustrative bottom plate was 0.06 $\Omega$/square.

After the bottom plate is deposited and patterned, a dielectric film 16 is deposited thereon using chemical vapor deposition. The capacitance per unit area of a thin film capacitor is equal to the ratio of the permittivity to the thickness of the dielectric layer. The minimum thickness of the dielectric layer is set by the yield and process control and breakdown requirements. The preferred material for the dielectric material is silicon nitride ($Si_3N_4$) because of its relatively high dielectric constant. It will, of course, be understood that other dielectric materials, such as silicon dioxide ($SiO_2$), aluminum oxide ($Al_2O_3$), or tantalum pentoxide ($Ta_2O_5$) may be substituted for the silicon nitride.

The specific dielectric constant of the silicon nitride layer will, however, vary with the depositing technique. For purposes of comparison, a silicon nitride layer deposited via vapor phase epitaxy yields a dielectric constant of approximately 7.6, while a dielectric layer produced by sputtering yields a dielectric constant of approximately 6.9. To obtain the desired capacitance of 300 pF/mm$^2$ while utilizing CVD as the deposition technique, a 0.2 $\mu$m thick layer of silicon nitride was utilized.

Next, the second metal layer or top plate 18 is defined by photolithography and gold electroplating to a thickness of 2 to 3 $\mu$m, thereby achieving the octagonal shape and a sheet resistance of 0.01 $\Omega$/sq, to reduce losses.

Figure 1C:
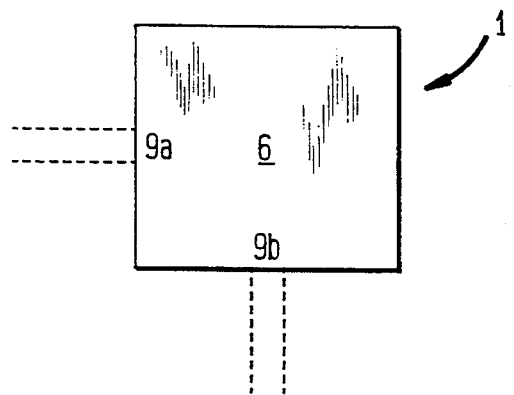
FIG. 1C is a plan view illustrating a bent feed connection to the conventional MIM capacitor depicted in FIG. 1A.
Figure 2B:
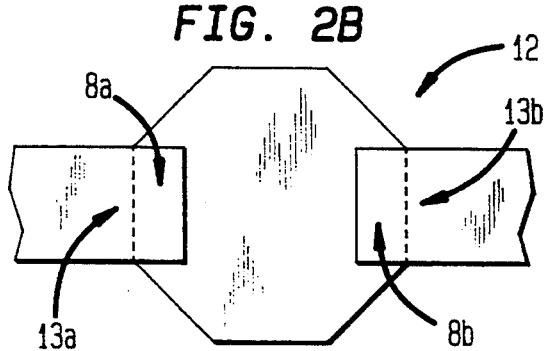
FIG. 2B is a plan view depicting a straight feed connection to the novel MIM capacitor depicted in FIG. 2A.
Figure 2C:
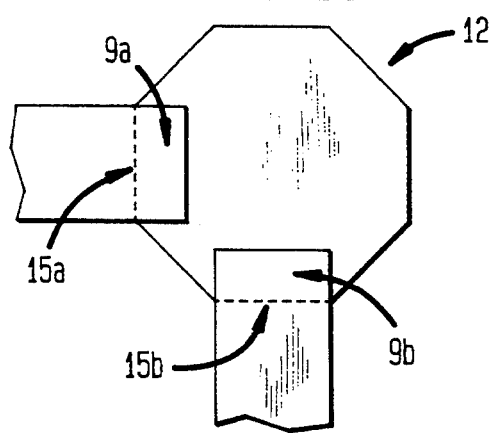
FIG. 2C is a plan view depicting a bent feed connection to the novel MIM capacitor depicted in FIG. 2A.

FIGS. 2B and 2C depict the octagonal capacitor embodiment of FIG. 2A in both the straight- and bent-feed configurations, respectively. Feed connections or connection ports are made to the top plate via air bridges, which are well known in the art. FIG. 2B depicts a straight feed configuration in which connections are made at connection ports defined by 8a and 8b proximate respective lateral sides 13a and 13b. FIG. 1C illustrates a bent-feed configuration in which connections are made at noncollinear ports 9a and 9b, proximate respective lateral sides 15a and 15b. In order to compare the performance characteristics of the rectangular/square configuration of FIG. 1A with those of the present invention, the straight and bent-feed configurations of FIGS. 1B, 1C, 2B, and 2C were each simulated and tested using a 125 $\mu$m thick GaAs substrate and a capacitance value of 5 pF. The TRL calibration technique was used to accurately deembed the performance of each component after measuring the reflection and transmission coefficients (i.e. S-parameters).

FIG. 3 compares the simulated return loss performance for the square and octagonal sided capacitors in straight and bent-feed configurations. The results were obtained using a very accurate electromagnetic simulator. These return loss plots are for series connected capacitors with their second ports terminated in 50 $\Omega$. Ideally, a series connected capacitor should behave as a high pass filter with near total reflection at lower frequencies and a good match at higher frequencies. Therefore, lower values for return loss in the plot of FIG. 3, for similar feed arrangements, illustrate the superior performance of the MIM capacitor of the present invention. Actual measured data for each capacitor and feed configuration, which is graphically represented in FIG. 4, also shows a substantial improvement in performance. The lower measured value of reflection coefficient at 19 GHz for the square capacitor with straight feed is attributable to the measurement resonance.

The superior performance of the octagonal capacitor embodiment of the present invention, as compared to prior art square/rectangular capacitors, may be attributed to several factors. The chamfered corners of the octagonal configuration substantially diminish the step discontinuity reactance between the feed line and the capacitor, thereby improving the frequency performance of the MMIC. The elimination of 90° corners in the present invention further improves the frequency performance of the MMIC by reducing the bend discontinuity reactance for non-collinear feed points. Additionally, the embodiment of FIG. 2A provides twice as many ports for matching networks and can thus accommodate from 5-8 ports should that many be required by the IC circuit. Empirically, the octagonal embodiment of the present invention has also been found to exhibit substantially improved performance at millimeterwave frequencies.

In accordance with the objective of the present invention to provide a MIM capacitor which is capable of accommodating more than four connections while minimizing discontinuity reactances, other configurations besides the preferred octagonal shape of the illustrative embodiment may also be employed. Essentially, any polygon having an even number of sides greater than four will provide the requisite level of layout flexibility to minimize the magnitude of the discontinuity reactances. However, an equiangular polygon is preferable. Accordingly, a capacitor constructed in accordance with the present invention may also, if desired, be configured as a hexagon, decagon, etc. It will, however, be noted that as additional sides are introduced, the configuration begins to approximate a circular shape and thus introduces further discontinuity reactances. It should also be noted that the sides of these various configurations need not be equal. For example, an octagonal configuration may be obtained by chamfering the corners of a square such that only alternate sides are of equal length.

Although the present invention has been described in detail, it should be understood that various changes, substitutions, and alterations can be made herein without departing from the spirit and scope of the invention as defined in the appended claims.

What is claimed is:

1. A capacitor element for an integrated circuit, comprising:
   a first layer, said first layer being formed of an electrically conductive material;
   a second layer, said second layer being formed of an electrically conductive material; and
   a third layer, said third layer being formed of a dielectric material and being disposed in laminar relation between said first and second layers, each of said layers has an octagonal shape for reducing the return loss characteristics of said capacitor element.

2. A capacitor element according to claim 1, wherein said integrated circuit is a monolithic circuit.

3. A capacitor element according to claim 1, wherein said integrated circuit is a microwave circuit.

4. A capacitor element according to claim 3, wherein said first layer is disposed on a seminsulating substrate.

5. A capacitor element according to claim 4, wherein said semi-insulating substrate is comprised of gallium arsenide.

6. A capacitor element according to claim 1, wherein said third layer is selected from the class consisting of silicon nitride, silicon dioxide, silica, and tantalum pentoxide.

7. A capacitor element according to claim 1, wherein said capacitor defines at least two connection ports, each of said connection ports being disposed on an upper surface of said second layer proximate a respective lateral side thereof.

8. A capacitor element according to claim 7, wherein said connection ports are on opposite lateral sides of said capacitor element.

9. A monolithic microwave integrated circuit comprising:
   a substrate of semi-insulating material; and
   at least one charge storing element disposed on said substrate, said charge storing element including a first layer of electrically conductive material positioned on said substrate, a second layer of electrically conductive material, and a layer of dielectric material laminarly disposed therebetween, wherein each of said layers has an octagon shape for reducing the return loss characteristics of said charge storage element.

10. A monolithic microwave integrated circuit according to claim 9, wherein each of said layers of said charge storing element is formed by chamfering corners defined by adjacent pairs of said sides.

11. A microwave integrated circuit according to claim 9, wherein said dielectric material is silicon nitride.

12. A microwave integrated circuit according to claim 9, wherein said charge storing element defines at least two connection ports for connection to other elements of said circuit, each of said connection ports being disposed on an upper surface of said second layer proximate a respective lateral side thereof.

* * * * *